(12) United States Patent
Han

(10) Patent No.: US 11,948,633 B2
(45) Date of Patent: Apr. 2, 2024

(54) RESISTIVE MEMORY DEVICE AND OPERATING METHOD OF THE RESISTIVE MEMORY DEVICE

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 184 days.

(21) Appl. No.: 17/544,543

(22) Filed: Dec. 7, 2021

(65) Prior Publication Data

US 2023/0017843 A1   Jan. 19, 2023

(30) Foreign Application Priority Data

Jul. 19, 2021  (KR) .................. 10-2021-0094378

(51) Int. Cl.
  *G11C 11/00*  (2006.01)
  *G11C 13/00*  (2006.01)
  *H10N 70/00*  (2023.01)
  *H10B 63/00*  (2023.01)

(52) U.S. Cl.
  CPC ........ *G11C 13/0028* (2013.01); *G11C 13/003* (2013.01); *G11C 13/0069* (2013.01); *H10N 70/826* (2023.02); *H10N 70/883* (2023.02); *G11C 13/0064* (2013.01); *G11C 2213/71* (2013.01); *G11C 2213/79* (2013.01); *H10B 63/30* (2023.02); *H10B 63/84* (2023.02)

(58) Field of Classification Search
  CPC .............. G11C 13/0028; G11C 13/003; H10N 70/826; H10N 70/833
  USPC ........................................ 365/148
  See application file for complete search history.

(56) References Cited

U.S. PATENT DOCUMENTS

| 8,169,819 | B2 | 5/2012 | Shima et al. | |
| 2017/0338238 | A1* | 11/2017 | Zhang | H10B 43/50 |
| 2019/0081066 | A1* | 3/2019 | Choi | H10B 43/27 |
| 2022/0336533 | A1* | 10/2022 | Lee | H10N 70/823 |

FOREIGN PATENT DOCUMENTS

KR   10-1728934 B1   12/2013

* cited by examiner

*Primary Examiner* — Vu A Le

(57) ABSTRACT

A resistive memory device includes: conductive layers and interlayer insulating layers, which are alternatively stacked; a vertical hole vertically penetrating the conductive layers and the interlayer insulating layers; a gate insulating layer disposed over an inner wall of the vertical hole; a charge trap layer disposed over an inner wall of the gate insulating layer; a channel layer disposed over an inner wall of the charge trap layer; and a variable resistance layer disposed over an inner wall of the channel layer.

24 Claims, 11 Drawing Sheets

RESISTIVE MEMORY DEVICE AND OPERATING METHOD OF THE RESISTIVE MEMORY DEVICE

CROSS-REFERENCE TO RELATED APPLICATION

The present application claims priority under 35 U.S.C. § 119(a) to Korean patent application number 10-2021-0094378, filed on Jul. 19, 2021, in the Korean Intellectual Property Office, the entire disclosure of which is incorporated herein by reference.

BACKGROUND

1. Technical Field

The present disclosure generally relates to a resistive memory device and a method of operating the resistive memory device. More particularly, a resistive memory device in which data can be stored according to a change in resistance and an operating method of the resistive memory device are disclosed.

2. Related Art

A memory device may be classified into a volatile memory device in which stored data is not maintained when the supply of power is interrupted and a nonvolatile memory device in which stored data is retained even when the supply of power is interrupted.

Examples of nonvolatile memory devices include a NAND flash memory, a NOR flash memory, a resistive random access memory (ReRAM), a phase-change random access memory (PRAM), a magnetoresistive random access memory (MRAM), a ferroelectric random access memory (FRAM), a spin transfer torque random access memory (STT-RAM), and the like.

Among the above examples, a nonvolatile memory device with a ReRAM may store data according to a change in resistance of a variable resistance layer. For example, a ReRAM may include a top electrode and a bottom electrode, to which voltages are applied, and may include a variable resistance layer, located between the top electrode and the bottom electrode, to store data. The variable resistance layer may be programmed to a high resistance state or a low resistance state according to voltages applied to the top electrode and the bottom electrode. The variable resistance layer may be maintained in a high resistance state or a low resistance state as a previous state or initial state until a subsequent voltage is applied to the top electrode or the bottom electrode.

SUMMARY

Embodiments provide a resistive memory device and an operating method of the resistive memory device, which can improve the reliability of a program operation.

In accordance with an aspect of the present disclosure, there is provided a resistive memory device including: conductive layers and interlayer insulating layers, which are alternatively stacked; a vertical hole vertically penetrating the conductive layers and the interlayer insulating layers; a gate insulating layer disposed over an inner wall of the vertical hole; a charge trap layer disposed over an inner wall of the gate insulating layer; a channel layer disposed over an inner wall of the charge trap layer; and a variable resistance layer disposed over an inner wall of the channel layer.

In accordance with another aspect of the present disclosure, there is provided a method for operating a resistive memory device, the method including: selecting a memory cell in a program operation of the resistive memory device, which includes word lines stacked on a substrate to be spaced apart from each other, a gate insulating layer vertically penetrating the word lines, and a charge trap layer, a channel layer, and a variable resistance layer that are sequentially formed on an inner wall of the gate insulating layer, trapping electrons in the charge trap layer of the selected memory cell connected to a selected word line; applying a turn-off voltage to the selected word line; applying a turn-on voltage to unselected word lines; and storing data in the variable resistance layer of the selected memory cell by applying a set voltage to one side of the portion of the channel layer corresponding to the selected word line and applying a ground voltage to the other side of the portion of the channel layer corresponding to the selected word line, wherein the one side and the other side of the portion of the channel layer corresponding to the selected word line are spaced apart in a vertical direction.

In accordance with still another aspect of the present disclosure, there is provided a method for operating a resistive memory device, the method including: selecting a memory cell in a program operation of the resistive memory device, which includes word lines stacked on a substrate to be spaced apart from each other, a gate insulating layer vertically penetrating the word lines, and a charge trap layer, a channel layer, and a variable resistance layer that are sequentially formed on an inner wall of the gate insulating layer, trapping electrons in the charge trap layer in an initialization phase of the program operation; and performing a set operation to trap electrons in the charge trap layer and to lower a resistance of the variable resistance layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, that element may be the only element between the two elements or one or more intervening elements may also be present. Like reference numerals refer to like elements throughout the disclosure.

DETAILED DESCRIPTION

The specific structural or functional description disclosed herein is merely illustrative for the purpose of describing embodiments according to the concepts of the present disclosure. The embodiments according to the concepts of the present disclosure can be implemented in various forms and should not be construed as limited to the embodiments set forth herein.

Figure 1:
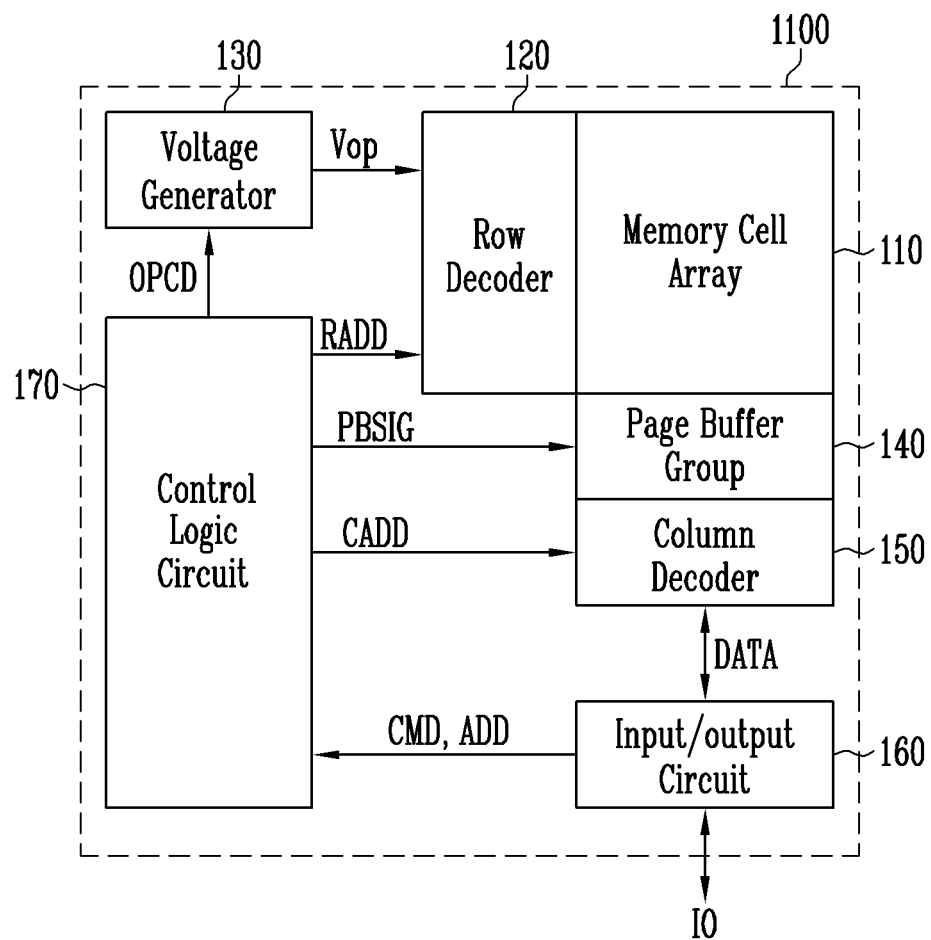
FIG. 1 is a diagram illustrating a resistive memory device in accordance with an embodiment of the present disclosure.

FIG. 1 is a diagram illustrating a resistive memory device in accordance with an embodiment of the present disclosure.

Referring to FIG. 1, a resistive memory device 1100 may include a memory cell array 110 in which data is stored and a peripheral circuit 120 to 170 capable of performing a program, read or erase operation.

The memory cell array 110 may include a plurality of memory blocks in which data is stored. Each of the memory blocks may include resistive random access memory cells, and the resistive random access memory cells may be implemented in a three-dimensional structure in which the resistive random access memory cells are stacked in a vertical direction above a substrate. The resistive random access memory cells may be configured such that resistance changes according to a voltage applied to an electrode.

The peripheral circuit 120 to 170 may include a row decoder 120, a voltage generator 130, a page buffer group 140, a column decoder 150, an input/output circuit 160, and a control logic circuit 170.

The row decoder 120 may select one memory block from among the memory blocks included in the memory cell array 110 according to a row address RADD and may transmit operating voltages Vop to the selected memory block.

The voltage generator 130 may generate and output the operating voltages Vop necessary for various operations in response to an operation code OPCD. For example, the voltage generator 130 may generate a set voltage, a reset voltage, a turn-on voltage, a turn-off voltage, a read voltage, an erase voltage, and the like in response to the operation code OPCD. The voltage generator 130 may selectively output the generated voltages. In an embodiment, the voltage generator 130 may generate voltage of 0V or higher as voltages to be applied to word lines and does not include a device for generating a negative voltage lower than 0V.

The page buffer group 140 may be connected to the memory cell array 110 through bit lines. For example, the page buffer group 140 may include page buffers connected to the respective bit lines (not illustrated). The page buffers may simultaneously operate in response to page buffer control signals PBSIG and temporarily store data in a program or read operation. The page buffers may sense a voltage of the bit lines, which varies according to threshold voltages of the memory cells, in a read operation or a verify operation. For example, when resistance of the resistive random access memory cells increases, a current of the bit lines decreases. When the resistance of the resistive random access memory cells decreases, the current of the bit lines increases. Therefore, the page buffers may be configured to sense a current of the bit lines, which may change according to resistance of selected memory cells.

The column decoder 150 may transmit data DATA between the input/output circuit 160 and the page buffer group 140 according to a column address CADD.

The input/output circuit 160 may be connected to an external device through input/output lines IO. For example, the external device may be a controller capable of transmitting a command CMD, an address ADD, or data DATA to the resistive memory device 1100. The input/output circuit 160 may input/output a command CMD, an address ADD, and data DATA through the input/output lines IO. For example, the input/output circuit 160 may transmit the command CMD and the address ADD, which are received from the external device, to the control logic circuit 170 through the input/output lines IO, and transmit the data DATA received from the external device to the column decoder 150 through the input/output lines IO. The input/output circuit 160 may output the data DATA received from the column decoder 150 to the external device through the input/output lines IO.

The control logic circuit 170 may output the operation code OPCD, the row address RADD, the page buffer control signals PBSIG, and the column address CADD in response to the command CMD and the address ADD. For example, the control logic circuit 170 may include software for performing an algorithm in response to the command CMD and may include hardware for outputting the address ADD and various control signals.

Figure 2:
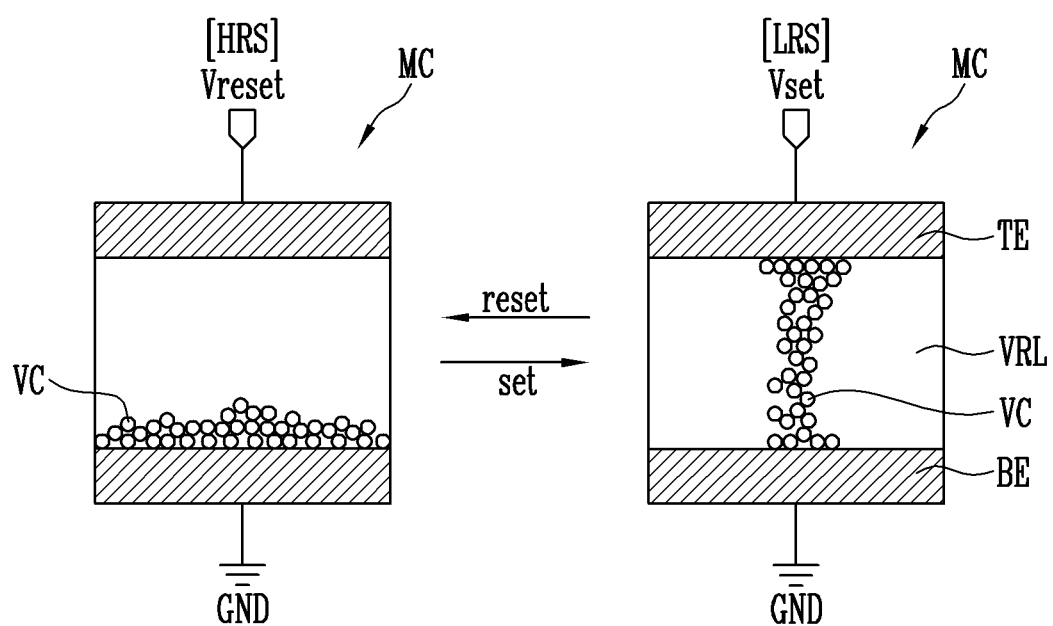
FIG. 2 is a view illustrating a state of a resistive random access memory cell in accordance with an embodiment of the present disclosure.

FIG. 2 is a view illustrating a state of a resistive random access memory cell in accordance with an embodiment of the present disclosure.

Referring to FIG. 2, a resistive random access memory cell MC may include a bottom electrode BE, a top electrode TE, and a variable resistance layer VRL. The bottom electrode BE and the top electrode TE may be formed of a conductive material, and the variable resistance layer VRL may be formed of a variable resistance material.

The bottom electrode BE and the top electrode TE may be formed of any one material, or two or more materials, from among aluminum (Al), copper (Cu), titanium nitride (TiN), titanium aluminum nitride ($Ti_xAl_yN_z$), iridium (Ir), platinum (Pt), silver (Ag), gold (Au), poly-silicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), and strontium zirconate oxide ($StZrO_3$).

The variable resistance layer VRL may be formed of a bipolar resistance memory material or a unipolar resistance memory material. A bipolar resistance memory material may be in a set or a reset state according to different voltages applied to the bottom electrode BE and the top electrode TE. Perovskite-based materials may be used as the bipolar resistance memory material in variable resistance layers VRL. A unipolar resistance memory material may be programmed to a set or a reset state by a voltage pulse of the same polarity. A transition metal oxide such as nickel oxide ($NiO_x$), titanium oxide ($TiO_x$), and the like may be used as the unipolar resistance memory material in variable resistance layers VRL.

Empty spaces, which are absent of atoms, exist in the variable resistance layer VRL and are referred to as vacancies VC. A vacancy VC has a polarity and may move within the variable resistance layer VRL according to voltages applied to the top electrode TE and the bottom electrode BE. For example, when a set voltage Vset is applied to the top electrode TE in the high resistance state HRS and a ground voltage GND is applied to the bottom electrode BE, vacancies VC may move toward the top electrode TE. The set voltage Vset may be a positive voltage. When the vacancies VC that are concentrated on the bottom electrode BE move toward the top electrode TE, a filament may be formed between the top electrode TE and the bottom electrode BE, and therefore the resistance of the variable resistance layer VRL decreases. When the resistance of the variable resistance layer VRL reaches a low level, the resistive random access memory cell MC becomes a low resistance state LRS, and in this state current flows through the resistive random access memory cell MC due to the low resistance.

When a reset voltage Vreset is applied to the top electrode TE of the resistive random access memory cell MC in the low resistance state LRS and the ground voltage GND is applied to the bottom electrode BE, the vacancies VC that have been concentrated on the top electrode TE may be moved to the bottom electrode BE, and therefore, no filament may be formed between the top electrode TE and the bottom electrode BE. When a filament is not formed between the top electrode TE and the bottom electrode BE, the resistance of the variable resistance layer VRL increases, and therefore, the resistive random access memory cell MC may become a high resistance state HRS. When the resistive random access memory cell MC is in the high resistance state HRS, no current may flow between the top electrode TE and the bottom electrode BE. The reset voltage Vreset may be a negative voltage lower than 0V.

That is, in the high resistance state HRS, the resistance of the variable resistance layer VRL increases, and therefore, the current may become low or may not flow. In the low resistance state LRS, the resistance of the variable resistance layer VRL decreases, and therefore, the current may flow and become high. The resistive random access memory cell MC may be programmed or erased to the set or reset state according to changes in resistance state.

Figure 3:
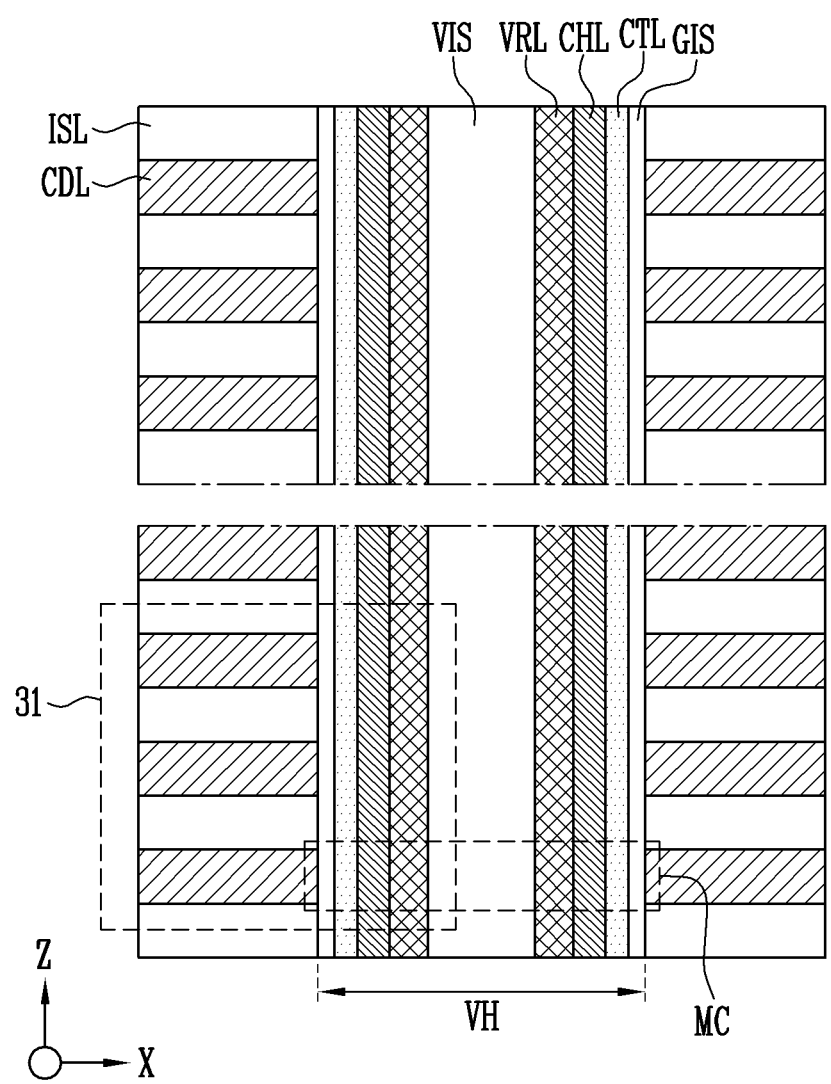
FIG. 3 is a sectional view illustrating a resistive memory device in accordance with an embodiment of the present disclosure.

FIG. 3 is a sectional view illustrating a resistive memory device in accordance with an embodiment of the present disclosure.

Referring to FIG. 3, a resistive memory device may include memory blocks including a plurality of resistive random access memory cells that comprise a portion of a string of the memory block.

The string may include a plurality of resistive random access memory cells, and the plurality of resistive random access memory cells may be connected to conductive layers CDL, which correspond to word lines. Interlayer insulating layers ISL may be formed between the conductive layers CDL. For example, the interlayer insulating layers ISL and the conductive layers CDL may be alternately stacked on a top or upper surface of a lower structure (not shown). The lower structure may include a substrate and at least one of a source line, a source select line, and peripheral circuits, which is formed on the substrate. The conductive layers CDL may be implemented as word lines or select lines. For example, assuming that the interlayer insulating layers ISL and the conductive layers CDL are alternately stacked on a substrate, the conductive layers CDL may include word lines and drain select lines. The interlayer insulating layers ISL may be formed of oxide, and the conductive layers CDL may be formed of a metal material such as tungsten, for example.

A vertical hole VH vertically penetrating the interlayer insulating layers ISL and the conductive layers CDL may be formed in the string, and a gate insulating layer GIS, a charge trap layer CTL, a channel layer CHL, a variable resistance layer VRL, and a vertical insulating layer VIS may be formed in the vertical hole VH. For example, the vertical hole VH may be formed in a cylindrical shape, and the gate insulating layer GIS, the charge trap layer CTL, the channel layer CHL, the variable resistance layer VRL, and the vertical insulating layer VIS may be sequentially formed from an inner wall of the vertical hole VH. The vertical insulating layer VIS may be formed in a pillar shape with a circular cross section to fill an inner center of the vertical hole VH, while the gate insulating layer GIS, the charge trap layer CTL, the channel layer CHL, and the variable resistance layer VRL may each be formed in a cylindrical, tubular shape.

In an embodiment, the variable resistance layer VRL may be used as a layer for storing data, and the charge trap layer CTL may be used to retain data stored in the variable resistance layer VRL. The channel layer CHL may be used to allow a current to flow in the string, and the gate insulating layer GIS may be used to retain electrons trapped in the charge trap layer CTL.

The gate insulating layer GIS and the vertical insulating layer VIS may include oxide. The charge trap layer CTL may include a material in which electrons can be trapped. For example, the charge trap layer CTL may include nitride or silicon nitride. The channel layer CHL may include poly-silicon. At least one of a phase variation material, a perovskite-based material, and a transition metal oxide such as $NiO_x$, $HfO_x$, $TaO_x$, $TiO_x$ or $SiHfO_x$ may be used in the variable resistance layer VRL.

Figure 4:
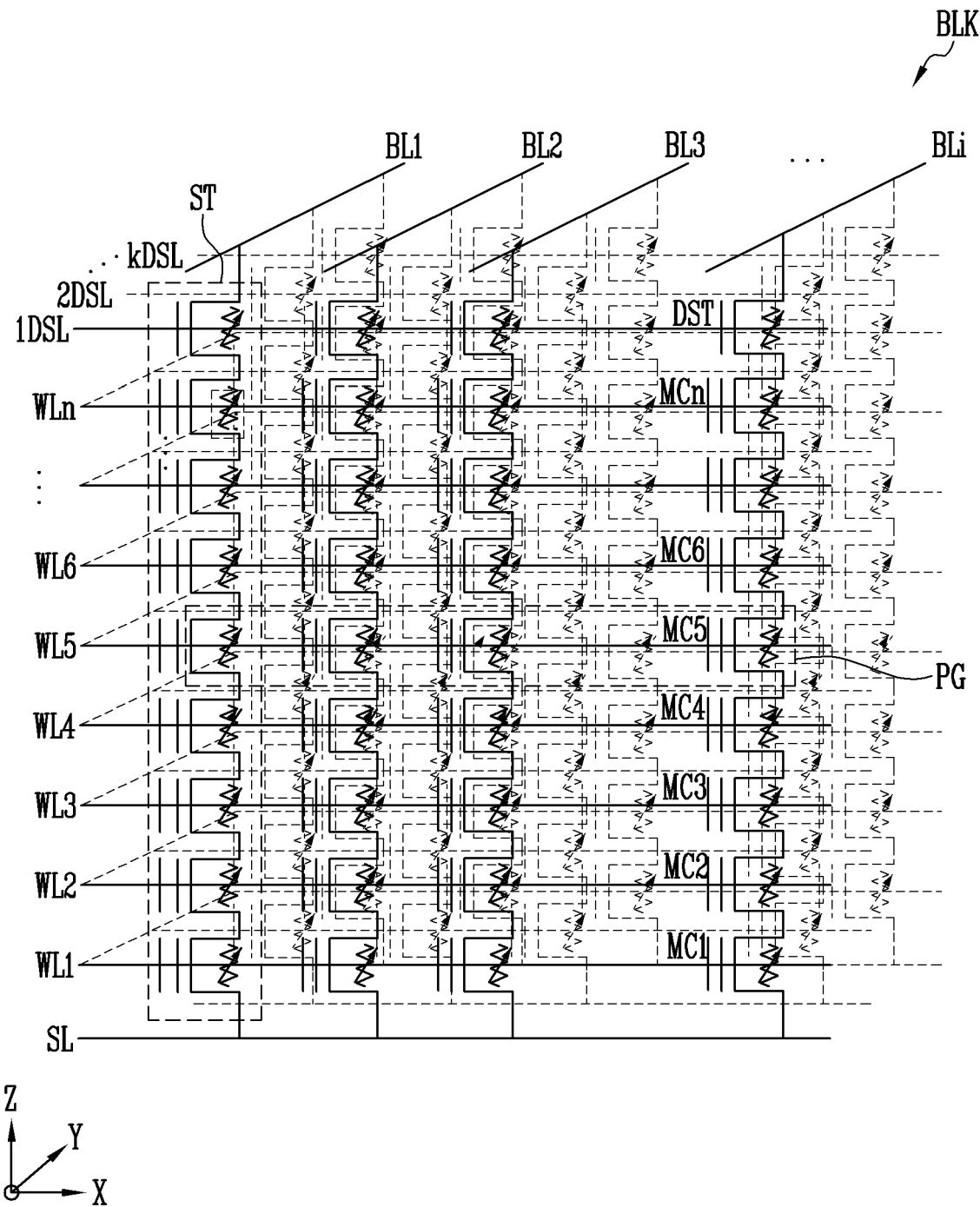
FIG. 4 is a circuit diagram illustrating a memory block in accordance with an embodiment of the present disclosure.

FIG. 4 is a circuit diagram illustrating a memory block in accordance with an embodiment of the present disclosure.

Referring to FIG. 4, a memory block BLK may include a plurality of strings ST. The plurality of strings ST may be connected between a source line SL and first to ith bit lines BL1 to BLi. Each of the strings ST may include first to nth memory cells MC1 to MCn and a drain select transistor DST. A string ST connected to the first bit line BL1 will be further described as an example. The string ST may include first to nth resistive random access memory cells MC1 to MCn and a drain select transistor DST, which are connected in series to each other between the source line SL and the first bit line BL1. The first resistive random access memory cell MC1 may be connected to the source line SL, and the drain select transistor DST may be connected to the first bit line BL1.

Gates of first to nth resistive random access memory cells MC1 to MCn included in different strings ST may be connected to first to nth word lines WL1 to WLn respectively, and gates of drain select transistors DST included in different strings ST may be connected to first to kth drain select lines 1DSL to kDSL respectively. A group of resistive random access memory cells connected to the same word line, from among the first to nth resistive random access memory cells MC1 to MCn, may form a page PG.

Assuming that the plurality of strings ST are arranged in an X direction and a Y direction as illustrated in FIG. 4, strings ST arranged in the Y direction may be commonly connected to one of the first to ith bit lines BL1 to BLi, which extend in the Y direction. The first to kth drain select lines 1DSL to kDSL, which are arranged in the Y direction, may be isolated from each other, and strings ST may be selected by a voltage applied to the first to kth drain select lines 1DSL to kDSL.

When selected resistive random access memory cells included in a selected page are programmed, a ground voltage GND may be applied to the source line SL, and a set voltage Vset or a reset voltage Vreset may be selectively applied to the first to ith bit lines BL1 to BLi. A turn-off voltage may be applied to a selected word line from among the first to nth word lines WL1 to WLn, and a turn-on voltage may be applied to unselected word lines among the first to nth word lines WL1 to WLn.

In an embodiment, a charge trap layer is included in the resistive random access memory cells, and therefore, a voltage of 0V, or a voltage greater than a negative voltage, may be used as the turn-off voltage that is applied to the selected word line.

Figure 5:
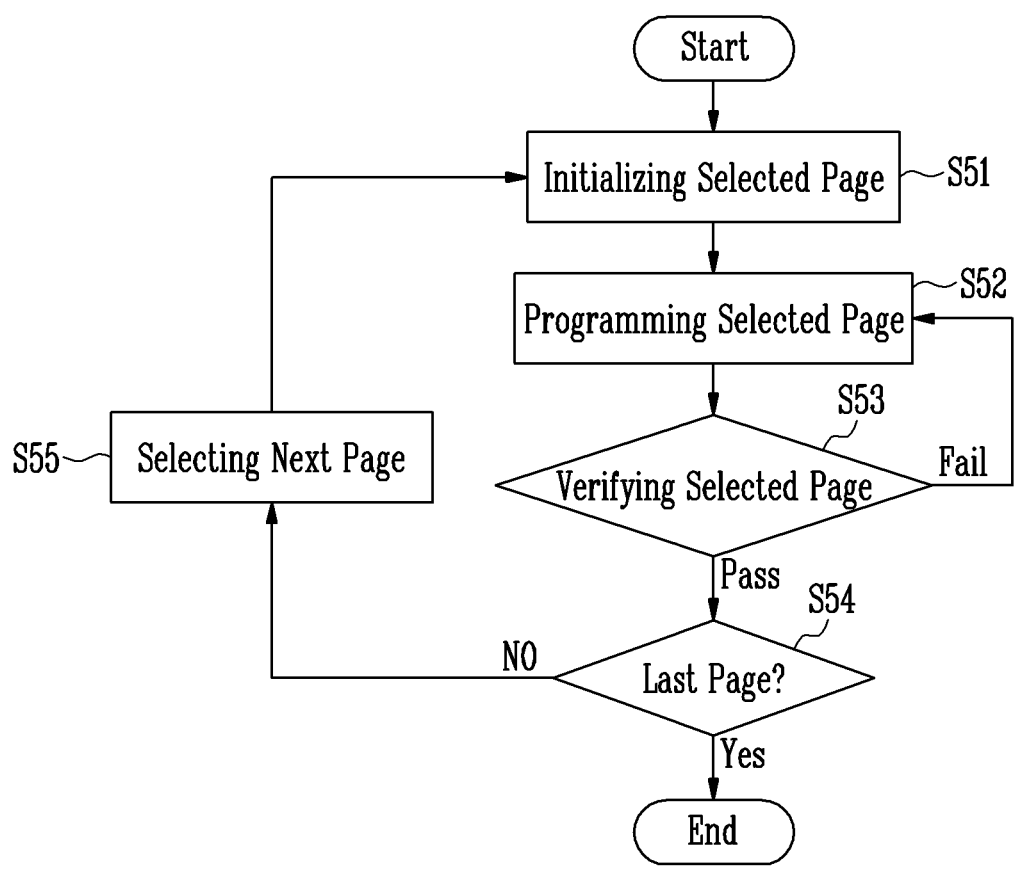
FIG. 5 is a diagram illustrating a program operation in accordance with an embodiment of the present disclosure.

FIG. 5 is a diagram illustrating a program operation in accordance with an embodiment of the present disclosure.

Referring to FIG. 5, a program operation in accordance with an embodiment may include step S51 of initializing a selected page, step S52 of programming the selected page, step S53 of verifying the selected page, step S54 of checking whether the selected page is a last page, and step S55 of selecting a next page.

In the step S51 of initializing the selected page, electrons may be trapped in a charge trap layer (CTL shown in FIG. 3) corresponding to the selected page. As shown in FIG. 3, the charge trap layer CTL extends in a vertical direction Z, and therefore, an initial voltage may be applied to a selected word line connected to the selected page in order to trap electrons only in the charge trap layer CTL corresponding to the selected page. The initial voltage may be set as a positive voltage having a level at which some of electrons included in the channel layer (CHL shown in FIG. 3) are induced to move to the charge trap layer CTL.

After the step S51 of initializing the selected page is performed, the step S52 of programming the selected page may be performed. The step S52 of programming the selected page may be referred to as a set operation. In the step S52 of programming the selected page, data may be stored in selected resistive random access memory cells included in the selected page. In an embodiment in which resistive random access memory cells are used, the resistive random access memory cells selected by a voltage applied to bit lines and a source line may be programmed.

After performing the step S52 of programming the selected page, the step 53 of verifying the selected page may be performed. The step 53 of verifying the selected page may be a step of checking whether a threshold voltage of the selected resistive random access memory cells has increased to a target level. For example, when the amount of current of the selected resistive random access memory cells does not increase up to a target amount, a verify operation may fail. When the verify operation fails, the steps S52 and S53 may be repeatedly performed. In the step S53, when the amount of current of the selected resistive random access memory cells increases up to the target amount, the page is verified and the verify operation may pass.

When the verify operation (S53) passes, the step S54 of checking whether the selected page, from among pages included in a selected memory block, is a last page may be performed.

When the selected page is not the last page (No), a next page may be selected (S55), and the step S51 of initializing the newly selected page may be performed. The steps S51 to S55 may be repeatedly performed until the selected page becomes the last page in the step S54 (Yes).

The above-described step S51 of initializing the selected page and step S52 of programming the selected page will be described in more detail as follows.

Figure 6A:
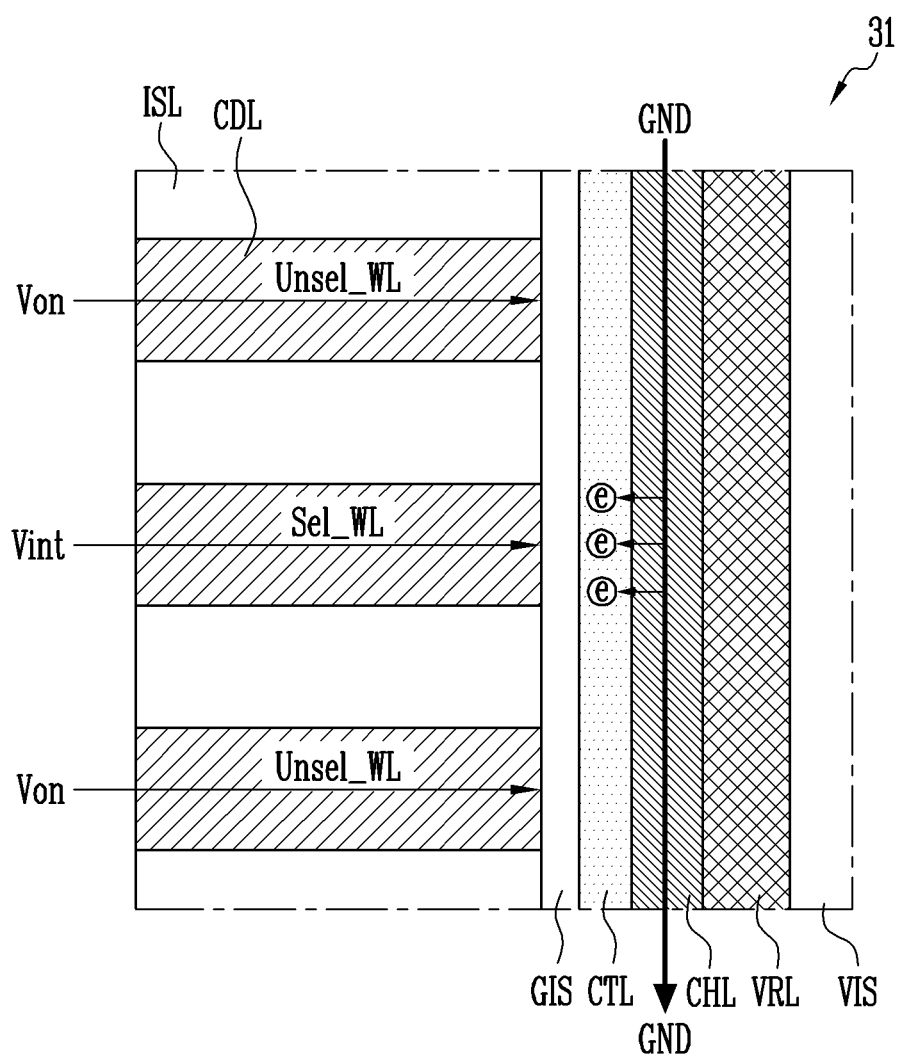
FIGS. 6A and 6B are views illustrating movement of electrons trapped in a charge trap layer in a program operation in accordance with an embodiment of the present disclosure.
Figure 6B:
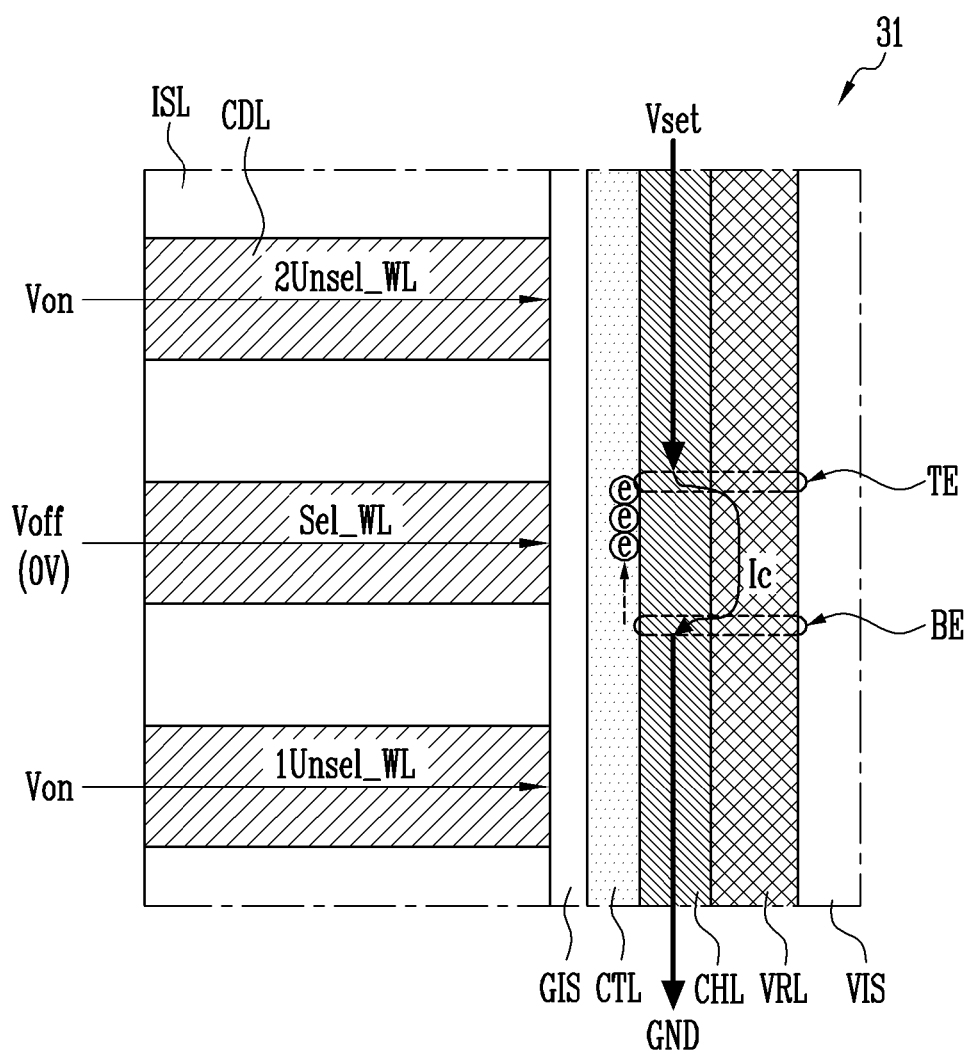

FIGS. 6A and 6B are views illustrating movement of electrons trapped in the charge trap layer in a program operation in accordance with an embodiment of the present disclosure. FIGS. 6A and 6B are enlarged views of a portion 31 in FIG. 3.

FIG. 6A is a view illustrating the step S51 of initializing the selected page, which is described with reference to FIG. 5. FIG. 6B is a view illustrating the step S52 of programing the selected page, which is described with reference to FIG. 5.

Referring to FIG. 6A, in the step S51 of initializing the selected page, a ground voltage GND may be applied to selected bit lines and the source line and a trap inhibit voltage may be applied to unselected bit lines such that electrons (e) are trapped in the charge trap layer CTL of the selected resistive random access memory cells included in the selected page. An initial voltage Vint may be applied to a selected word line Sel_WL, and a turn-on voltage Von may be applied to the other unselected word lines Unsel_WL other than the selected word line Sel_WL. The turn-on voltage Von is a voltage for forming a channel in a channel layer CHL corresponding to the unselected word lines Unsel_WL, and may be set as a positive voltage. The initial voltage Vint may be set as a positive voltage that is higher than the turn-on voltage Von. When the initial voltage Vint is applied to the selected word line Sel_WL in a state in which the ground voltage GND is applied to the channel layer CHL, some electrons (e) from among electrons included in the channel layer CHL may move into the charge trap layer CTL, in which the moved electrons are trapped. Because the gate insulating layer GIS is located between the charge trap layer CTL and the selected word line Sel_WL, the electrons (e) trapped in the charge trap layer CTL do not move into the selected word line Sel_WL, but remain trapped in the charge trap layer CTL.

Referring to FIG. 6B, in the step S52 of programming the selected page, a ground voltage GND may be applied to the source line and a set voltage Vset may be applied to the selected bit lines in order to lower the resistance of a variable resistance layer VRL of the selected resistive random access memory cells. The set voltage Vset may be set as a positive voltage. The turn-on voltage Von may be applied to the unselected word lines 1Unsel_WL and 2Unsel_WL such that the set voltage Vset is transferred to a top electrode of the selected resistive random access memory cell and the ground voltage is transferred to a bottom electrode of the selected resistive random access memory cell. A turn-off voltage Voff may be applied to the selected word line Sel_WL.

The turn-off voltage Voff may be a voltage that does not allow any channel to be formed in a channel layer CHL of a region corresponding to the selected resistive random access memory cells, which allows the variable resistance layer VRL to maintain a low resistance state LRS. Therefore, while the turn-off voltage Voff was conventionally used as a negative voltage having a low level, the turn-off voltage may be set to 0V or higher in this embodiment. When the turn-off voltage Voff is set as a negative voltage, a device for generating the negative voltage is to be included. However, when the turn-off voltage Voff is set to 0V, voltages applied to word lines may be generated using only a device for generating a positive voltage, without a device for generating the negative voltage.

An upper portion of the variable resistance layer VRL corresponding to the selected resistive random access memory cell may become a top electrode TE of the resistive random access memory cell, and a lower portion of the variable resistance layer VRL corresponding to the selected resistive random access memory cell may become a bottom electrode BE of the resistive random access memory cell. That is, the top electrode TE and the bottom electrode BE are common to the selected word line Sel_WL to which the turn-off voltage Voff is applied. For example, a portion of the variable resistance layer VRL corresponding to a top surface of the selected word line Sel_WL may become the top electrode TE, and a portion of the variable resistance layer VRL common to a bottom surface of the selected word line Sel_WL may become the bottom electrode BE.

A top electrode TE and a bottom electrode BE can be distinguished from each other within the channel layer CHL so that the set voltage Vset may also be applied to the top electrode TE of the channel layer CHL. Because the set voltage Vset is a positive voltage, electrons ⓔ trapped in the charge trap layer CTL may be moved toward the top electrode TE in the charge trap layer CTL. That is, negative charges may accumulate in a region of the top electrode common to the charge trap layer CTL as compared with the bottom electrode BE. Electrons ⓔ that are uniformly trapped in the whole of upper and lower portions of the selected word line Sel_WL are moved toward the top electrode TE.

In an example, electrons ⓔ trapped in the charge trap layer CTL can be trapped in the charge trap layer CTL until an erase voltage is applied. As a result, a change in threshold voltage of the variable resistance layer VRL can be suppressed by the electrons ⓔ trapped in the charge trap layer CTL. For example, since negative charges generated by the electrons ⓔ trapped in the charge trap layer CTL also influences on the variable resistance layer VRL, the movement of a filament formed in the variable resistance layer VRL can be suppressed. Thus, a filament formed between the top electrode TE and the bottom electrode BE is maintained so that a current Ic can flow through the variable resistance layer VRL of the selected resistive random access memory cell.

Figure 7:
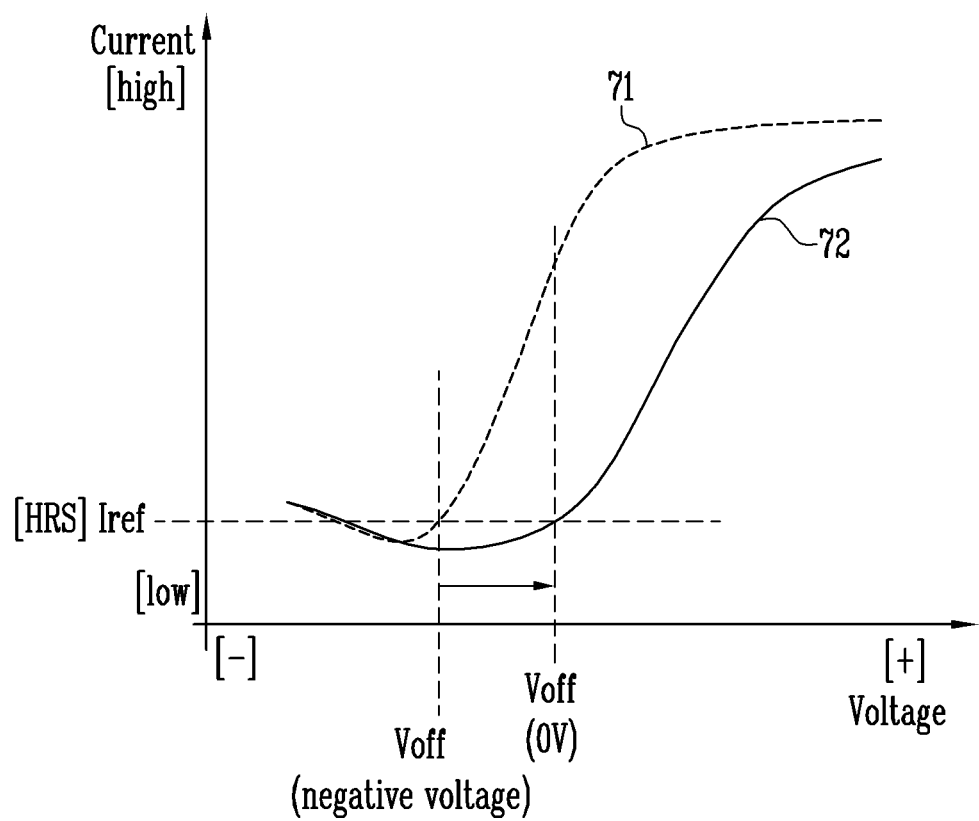
FIG. 7 is a graph illustrating a current of a resistive random access memory cell in accordance with an embodiment of the present disclosure.

FIG. 7 is a graph illustrating a current of a resistive random access memory cell in accordance with an embodiment of the present disclosure.

Referring to FIG. 7, in order to distinguish off-cells and on-cells from each other among resistive random access memory cells, a turn-off voltage Voff having a sufficiently low negative voltage, which is applied to a selected word line, was used in conventional art (71). However, in accordance with a disclosed embodiment (72), a reference current Iref of off-cells corresponding to a high resistance state HRS may be detected by the turn-off voltage of 0V. Thus, in accordance with this embodiment, a device for generating zero and a positive voltage applied to word lines is used, and a device for generating a negative voltage is not required. That is, voltages applied to the word lines in a program, read or erase operation can all be generated using only a device capable of generating a voltage of 0V or higher.

Figure 8:
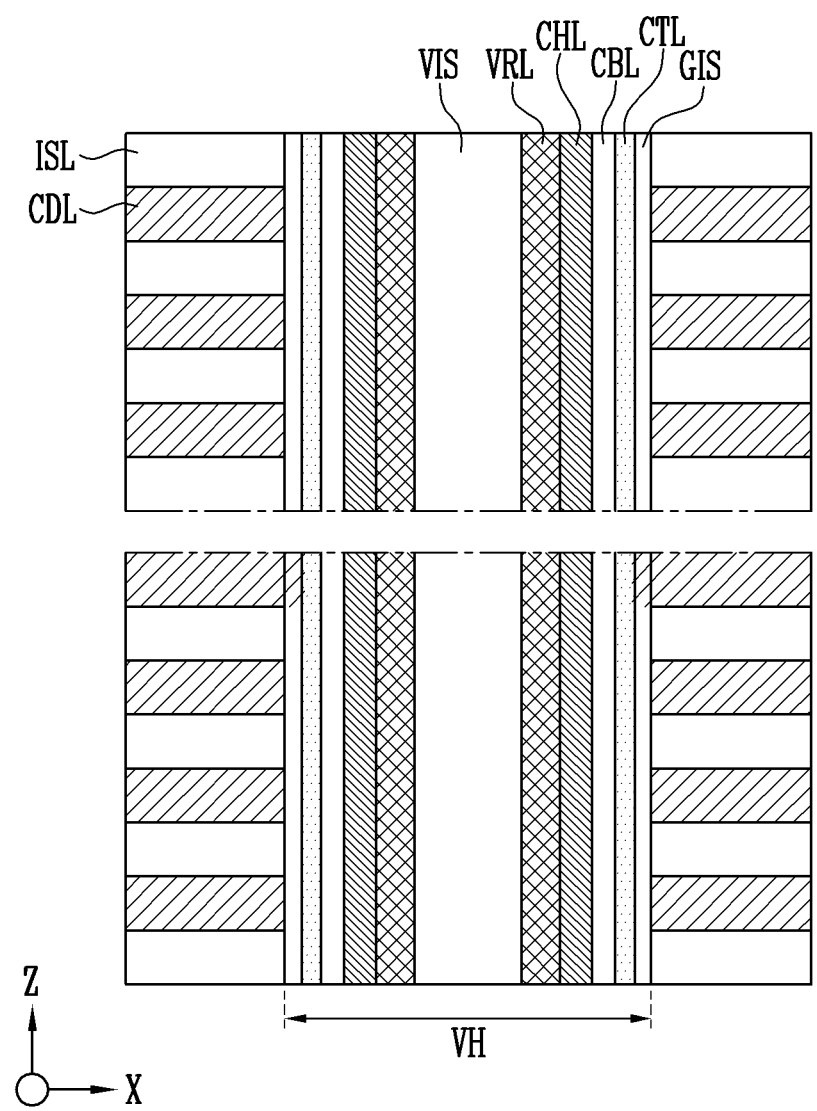
FIG. 8 is a sectional view illustrating a resistive memory device in accordance with an embodiment of the present disclosure.

FIG. 8 is a sectional view illustrating a resistive memory device in accordance with an embodiment of the present disclosure.

Referring to FIG. 8, in a resistive memory device in accordance with another embodiment of the present disclosure, a charge blocking layer CBL may be further formed between a charge trap layer CTL and a channel layer CHL within a vertical hole VH. The charge blocking layer CBL may be an oxide layer. The charge blocking layer CBL may be designed to stop the flow of trapped electrons out of the charge trap layer CTL.

A program operation of the resistive memory device including the charge blocking layer CBL is identical to the above-described program operation, and therefore, overlapping descriptions will be omitted.

Figure 9:
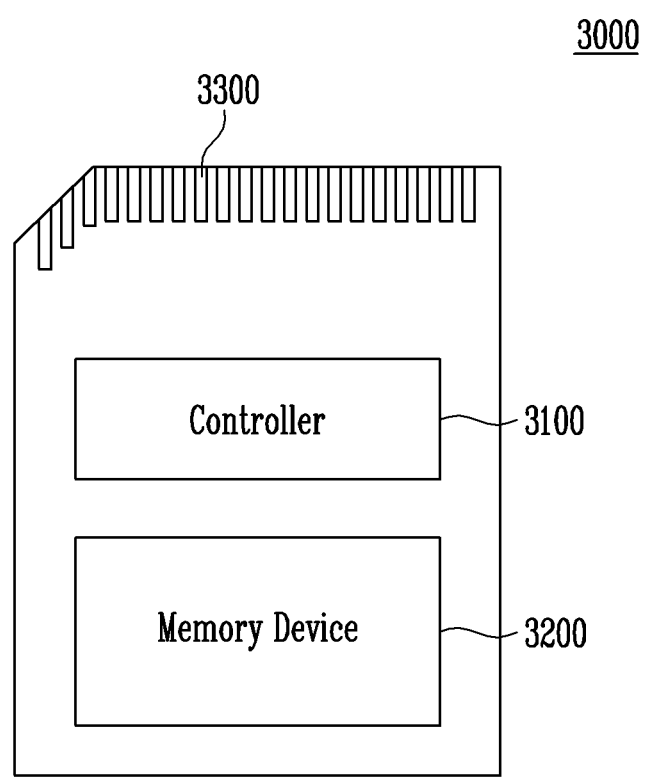
FIG. 9 is a diagram illustrating a memory card system to which a resistive memory device of the present disclosure is applied.

FIG. 9 is a diagram illustrating a memory card system to which a resistive memory device of the present disclosure is applied.

Referring to FIG. 9, a memory card system 3000 includes a controller 3100, a memory device 3200, and a connector 3300.

The controller 3100 may be connected to the memory device 3200. The controller 3100 may access the memory device 3200. For example, the controller 3100 may control a program, read or ease operation, or control a background operation of the memory device 3200. The controller 3100 may provide an interface between the memory device 3200 and a host. The controller 3100 may drive firmware for controlling the memory device 3200. For example, the controller 3100 may include components such as a Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. For example, the controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), FireWire, a Universal Flash Storage (UFS), Wi-Fi, Bluetooth, and NVMe. For example, the connector 3300 may be defined by at least one of the above-described various communication protocols.

The memory device 3200 may include resistive random access memory cells that are identical in configuration to the resistive random access memory cells in a resistive memory device 1100 shown in FIG. 1 and may operate in the same manner.

The controller 3100 and the memory device 3200 may be integrated into a single semiconductor device, to constitute a memory card. For example, the controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 10:
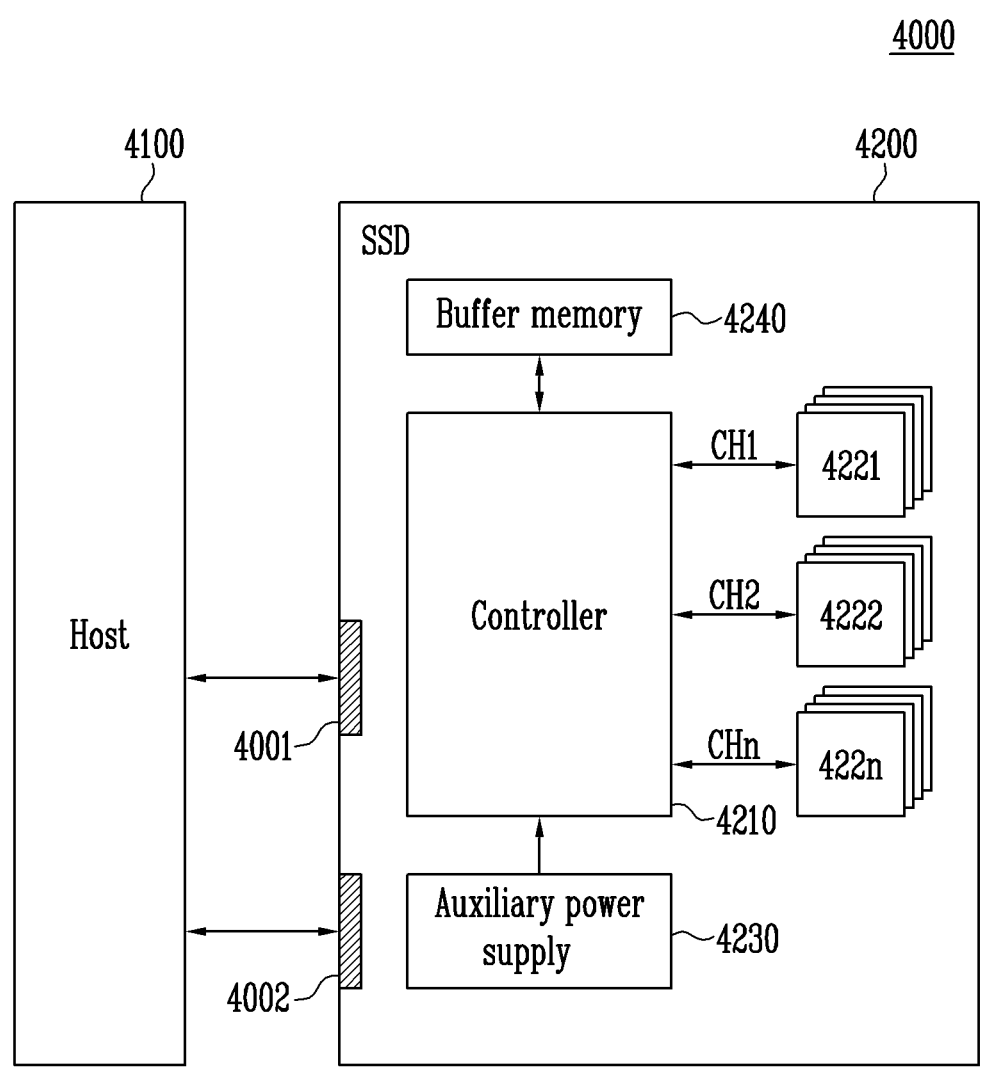
FIG. 10 is a diagram illustrating a Solid State Drive (SSD) system to which a resistive memory device of the present disclosure is applied.

FIG. 10 is a diagram illustrating a Solid State Drive (SSD) system to which a resistive memory device of the present disclosure is applied.

Referring to FIG. 10, an SSD system 4000 includes a host 4100 and an SSD 4200. The SSD 4200 exchanges a signal with the host 4100 through a signal connector 4001, and receives power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. For example, the signal may be a signal based on an interface between the host 4100 and the SSD 4200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a FireWire, a Universal Flash Storage (UFS), a WI-FI, a Bluetooth, and an NVMe.

The plurality of memory devices 4221 to 422n may be configured to store data, and include resistive random access memory cells. Each of the plurality of memory devices 4221 to 422n may be configured identically to the resistive memory device 1100 shown in FIG. 1 and may operate in the same manner.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide the power of the SSD 4200. For example, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of memory devices 4221 to 422n, or temporarily store metadata (e.g., a mapping table) of the memory devices 4221 to 422n. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, retention characteristics of resistive memory devices can be improved, and thus the reliability of a program operation or a read operation of the resistive memory devices can be improved.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A resistive memory device comprising:
   conductive layers and interlayer insulating layers, which are alternatively stacked;
   a vertical hole vertically penetrating the conductive layers and the interlayer insulating layers;
   a gate insulating layer disposed over an inner wall of the vertical hole;
   a charge trap layer disposed over an inner wall of the gate insulating layer;
   a channel layer disposed over an inner wall of the charge trap layer; and
   a variable resistance layer disposed over an inner wall of the channel layer.

2. The resistive memory device of claim 1, wherein the charge trap layer includes a material for trapping electrons.

3. The resistive memory device of claim 1, wherein the charge trap layer includes nitride or silicon nitride.

4. The resistive memory device of claim 1, wherein the channel layer includes poly-silicon.

5. The resistive memory device of claim 1, wherein the variable resistance layer includes at least one material selected from a phase variation material, a perovskite-based material, and a transition metal oxide.

6. The resistive memory device of claim 5, wherein the transition metal oxide is formed of at least one of $NiO_x$, $HfO_x$, $TaO_x$, $TiO_x$, and $SiHfO_x$.

7. The resistive memory device of claim 1, wherein the conductive layers are implemented as word lines and drain select lines.

8. The resistive memory device of claim 7, wherein the conductive layers that are implemented as word lines are stacked on a substrate, and
   wherein the conductive layers that are implemented as drain select lines are disposed on the top of the conductive layers that are implemented as word lines.

9. The resistive memory device of claim 1, further comprising a charge blocking layer disposed between the charge trap layer and the channel layer.

10. The resistive memory device of claim 9, wherein the charge blocking layer includes an oxide layer.

11. A method for operating a resistive memory device, the method comprising:
    selecting a memory cell in a program operation of the resistive memory device, which includes word lines stacked on a substrate to be spaced apart from each other, a gate insulating layer vertically penetrating the word lines, and a charge trap layer, a channel layer, and a variable resistance layer that are sequentially formed on an inner wall of the gate insulating layer, trapping electrons in the charge trap layer of the selected memory cell connected to a selected word line;

applying a turn-off voltage to the selected word line;

applying a turn-on voltage to unselected word lines; and storing data in the variable resistance layer of the selected memory cell by applying a set voltage to one side of the portion of the channel layer corresponding to the selected word line and applying a ground voltage to the other side of the portion of the channel layer corresponding to the selected word line, wherein the one side and the other side of the portion of the channel layer corresponding to the selected word line are spaced apart in a vertical direction.

12. The method of claim 11, wherein the trapping of the electrons in the charge trap layer includes:

applying the ground voltage to the one side and the other side of the portion of the channel layer corresponding to the selected word line;

applying the turn-on voltage to the unselected word lines; and applying an initial voltage to the selected word line.

13. The method of claim 12, wherein the initial voltage is a positive voltage that is greater than the turn-on voltage.

14. The method of claim 11, wherein the turn-on voltage is a positive voltage that forms a channel in the channel layer.

15. The method of claim 11, wherein the turn-off voltage is a voltage that is not a negative voltage.

16. The method of claim 11, wherein the turn-off voltage is 0V.

17. The method of claim 11, wherein the storing of the data in the variable resistance layer of the selected memory cell includes lowering a resistance of the variable resistance layer by using the set voltage and the ground voltage such that a current flows through the variable resistance layer of the selected memory cell.

18. The method of claim 11, wherein the set voltage is a positive voltage.

19. The method of claim 11, wherein the set voltage is applied to the channel layer through a bit line in contact with the one side of the portion of the channel layer corresponding to the selected word line in the storing of the data in the variable resistance layer.

20. The method of claim 11, wherein the ground voltage is applied to the channel layer through a source line in contact with the other side of the portion of the channel layer corresponding to the selected word line in the storing of the data in the variable resistance layer.

21. A method for operating a resistive memory device, the method comprising:

selecting a memory cell in a program operation of the resistive memory device, which includes word lines stacked on a substrate to be spaced apart from each other, a gate insulating layer vertically penetrating the word lines, and a charge trap layer, a channel layer, and a variable resistance layer that are sequentially formed on an inner wall of the gate insulating layer, trapping electrons in the charge trap layer in an initialization phase of the program operation; and performing a set operation to trap electrons in the charge trap layer and to lower a resistance of the variable resistance layer.

22. The method of claim 21, wherein the initialization phase of the program operation includes:

applying a ground voltage to one side and the other side of the portion of the channel layer corresponding to a selected word line;

applying a turn-on voltage to unselected word lines; and applying an initial voltage to the selected word line.

23. The method of claim 22, wherein the turn-on voltage is a positive voltage.

24. The method of claim 23, wherein the initial voltage is a positive voltage that is greater than the turn-on voltage.

* * * * *